June 29, 1965 R. M. PINCUS 3,192,481

SIGNAL AMPLITUDE DISCRIMINATOR

Filed Sept. 10, 1962

INVENTOR.
RALPH M. PINCUS

BY H. S. Mackey

ATTORNEY

United States Patent Office 3,192,481

Patented June 29, 1965

3,192,481
SIGNAL AMPLITUDE DISCRIMINATOR

Ralph M. Pincus, New York, N.Y., assignor to General Precision, Inc., a corporation of Delaware
Filed Sept. 10, 1962, Ser. No. 222,372
6 Claims. (Cl. 328—151)

Figure 1:
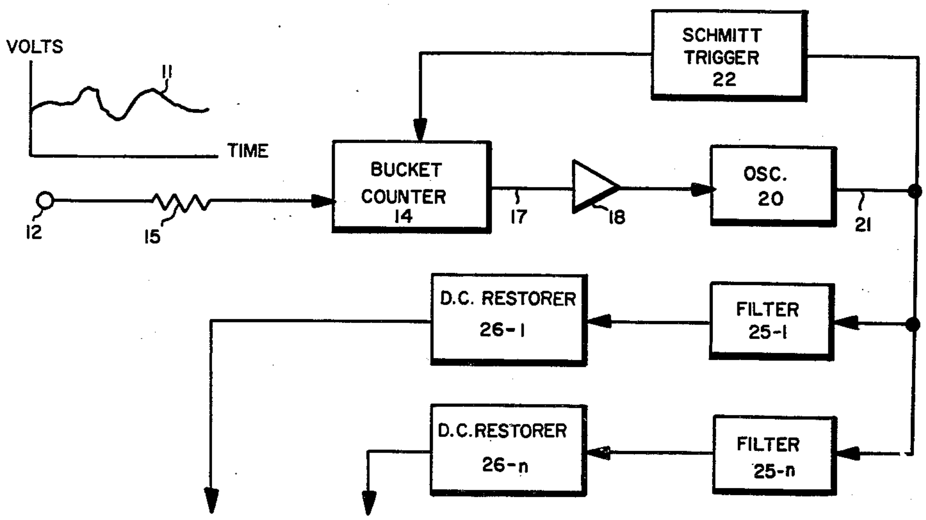

This invention relates to signal amplitude discriminators or detectors and more particularly to a detector which employs proportional amplitude-to-frequency conversion and frequency discrimination for securing the desired output.

In an ever-increasing number of electronic circuits and systems it is necessary or desirable to detect or discriminate between different signal amplitudes. A wide variety of devices are available for performing this function. Prior art devices suitable for performing this function include diode gates, Schmitt triggers, and other voltage-responsive electronic circuits or components. However, these prior art devices each have substantially the same drawback since they are all subject to hysteresis effects to a greater or lesser degree which impairs their linearity and limits both accuracy and usefulness.

One object of this invention is to provide an accurate voltage level discriminator which is linear in operation.

Another object of this invention is to provide a voltage discriminator which is suitable for detecting voltage levels over limited or large ranges.

Yet another object is to provide a voltage level discriminator which is capable of detecting one or more voltage levels or ranges of voltage levels.

The invention contemplates a voltage level discriminator comprising first means responsive to an independently variable direct current voltage for supplying a single-frequency alternating voltage proportional to the instantaneous magnitude of the direct current voltage and second means responsive to the said single-frequency alternating voltage for providing an output at preselected frequencies only.

The foregoing and other objects and advantages of the invention will become more apparent from a consideration of the drawings and specification wherein one embodiment of the invention is shown and described in detail for illustration purposes only.

Figure 2:
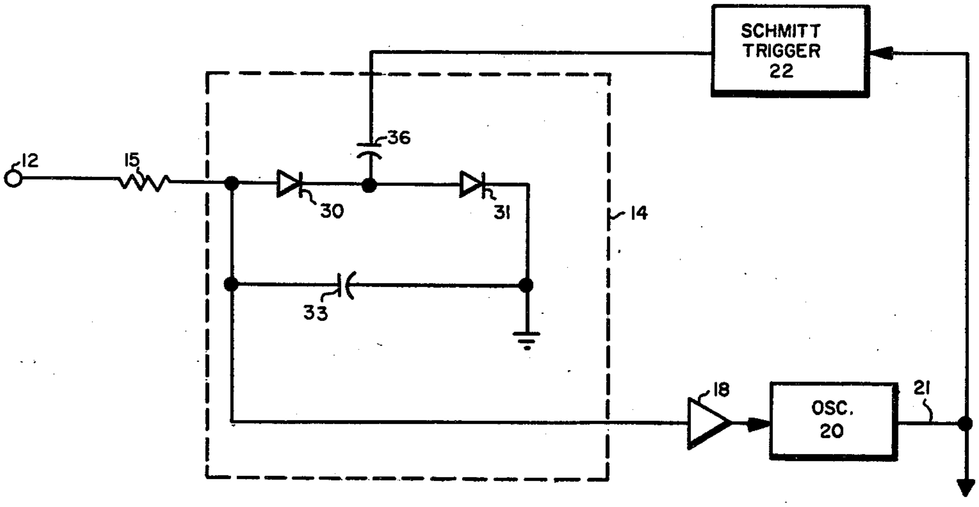

In the drawings:

FIGURE 1 is a block diagram of a novel voltage level discriminator constructed in accordance with the invention; and, FIGURE 2 is a schematic and block diagram of a novel linear voltage-to-frequency convertor suitable for use in the circuit shown in FIGURE 1.

In FIGURE 1 an independently variable direct current voltage, shown graphically at 11, is applied to an input terminal 12 which is connected to one input of a bucket counter 14 by a resistor 15. Bucket counter 14 is shown in detail in FIGURE 2 in addition to other components which together comprise the novel voltage-to-frequency convertor previously referred to. A detailed description of the counter and the associated elements shown in FIGURE 2 will follow the description of FIGURE 1.

The output of bucket counter 14 on conductor 17 is applied to a high-gain direct current amplifier 18 which controls a variable oscillator 20. Oscillator 20 provides an alternating output on a conductor 21. This output is fed back to the second input of bucket counter 14 through a Schmitt trigger circuit 22 which squares the oscillator output and in addition provides a constant peak-to-peak voltage regardless of frequency. The frequency F of the oscillator output fed back to bucket counter 14 through Schmitt trigger 22 equals $$F=f\ (E)=kE \qquad (1)$$

where E equals the instantaneous voltage applied at terminal 12. A proof of the Expression 1 will be provided with the description of FIGURE 2. From Expression 1 it is seen that the frequency of oscillator 20 and Schmitt trigger 22 follows the magnitude of the voltage applied at input terminal 12.

One or more filters, 25–1 through 25–$n$, each having a unique characteristic, are connected in parallel to conductor 21. Filters 25–1 through 25–$n$ are connected to direct current restorers 26–1 through 26–$n$, respectively. Each of the restorers provides an output on a separate conductor which may be manually or automatically monitored.

The number of filters 25 required for each application and the characteristics of each filter will be determined solely by the information needed relative to the input voltage E at terminal 12. The simplest case is where the only information required is whether E is below or above a predetermined voltage. In this instance a single low-pass filter will provide the information. The upper cutoff frequency of the filter is determined by Equation 1 $F=kE$. The value of $k$ will depend on the circuit parameters of FIGURE 2 and will be fully explained later. Once the upper cutoff limit of the filter is selected all voltages at the input below the selected voltage will provide alternating outputs having frequencies below the cutoff frequency of the filter, and the direct current restorer circuit will provide a current indicating that the input voltage is between zero and the value of E substituted in Equation 1. Alternatively, a high-pass filter with the same lower cutoff frequency may be used and will provide the complement of the above output.

If it is desired to detect a single range of voltages, frequencies $F_1$ and $F_2$ are computed using Equation 1 and the lowest and highest voltage in the range. A filter having a lower and upper cutoff frequency corresponding to $F_1$ and $F_2$, respectively, is connected to the oscillator output and the restorer will provide a direct current output whenever the input voltage E falls between the lower and upper limits.

Where more than one range is required a filter for each range, constructed as above, may be used and the restorer associated with each filter will provide a direct current output for indicating that the input voltage is within that range. Here also the outputs may be manually or automatically monitored or otherwise employed. The arrangement described above is particularly useful in those instances where the input E may vary over the entire range and it is desired to know where it is at all times since each filter may take over at the point where the last drops off.

The accuracy with which a range may be detected is a function of the filter characteristics and if a high degree of accuracy is required, the filters must have sharp cutoffs. It is possible to utilize a single filter for detecting multiple ranges one at a time by inserting a frequency multiplier between the oscillator output and the filter input. This arrangement permits the use of a single very accurate filter to cover a plurality of bands at a reduced cost over multiple filters. However, at any one setting of the multiplier circuit the unit acts as a single filter detector, whereas a multiple filter unit is capable of detecting a plurality of ranges simultaneously.

The linear direct current voltage-to-frequency convertor shown in FIGURE 2 employs a basic bucket counter 14 which is fully described in United States Patent No. 2,584,866 of John W. Gray. However, both its use and connection vary materially from that disclosed in the about patent.

The voltage E applied at terminal 12 is connected through resistor 15 to the anode of a diode 30. The cathode of diode 30 is connected to the anode of a second diode 31 which has its cathode connected to ground. A large smoothing capacitor 33 is connected across diodes 30 and 31.

The anode of diode 30 is connected to high-gain amplifier 18 which has its output connected to variable oscillator 20. A feedback loop from the output of oscillator 20 to the common junction of diodes 30 and 31 includes Schmitt trigger circuit 22 and a capacitor 36 connected serially. Schmitt trigger 22 is, as previously pointed out, necessary to provide a square wave of constant amplitude having the same frequency as oscillator 20. This is necessary since the peak-to-peak voltage V applied to capacitor 36 must be maintained constant over the entire range of operation.

Capacitor 36 is charged and discharged once in each cycle of the output from Schmitt trigger 22 which operates at the same frequency as oscillator 20. The charging current $i_{in}$ for capacitor 36 comes from source E through resistor 15 and diode 30, and the total charge Q on capacitor 36 equals $V \times C$ where V is the peak-to-peak voltage of the output of Schmitt trigger 22 and C is the capacitance of capacitor 36.

The total charge Q also equals the integral per cycle of $i_{in}dt$ and since $i_{in}$ equals $i_{out}$, it also equals the integral per cycle of $i_{out}dt$. The current I through resistor 15 equals $i_{in}$ average which in turn equals the integral per cycle of $i_{in}dt$ divided by the integral per cycle of $dt$. The above fraction equals FQ where F is the frequency of Schmitt trigger 22 since the reciprocal of the integral per cycle of $dt$ equals F and the integral per cycle of $i_{in}dt$ equals Q.

The voltage drop, E, across resistor 15, assuming that diodes 30 and 31 are ideal, equals $I \times R$ where R is the resistance of resistor 15 and by substitution $$E=FQR=VFRC \quad (2)$$

and solving for F $$F=E/VRC=kE \quad (3)$$

since VRC is a constant if the peak-to-peak vlotage from Schmitt trigger 22 is maintained constant without regard to frequency.

It is readily seen from the above that the frequency of oscillator 20 and Schmitt trigger 22 is controlled directly by the voltage applied at input terminal 12. Thus the frequency of oscillator 20 is a linear function of the voltage applied at input terminal 12 at all times.

While only one embodiment of the invention has been shown and described in detail for illustration purposes, it should be clearly understood that the invention is not limited to the specific details disclosed.

What is claimed is:

1. A voltage level discriminator comprising,
 equating means equating a unidirectional voltage to the frequency of an alternating current having an alternating current input, a direct current input and a direct current output,
 means for connecting said direct current input to an independently variable source of direct current voltage,
 a high-gain direct current amplifier connected to said direct current output,
 an oscillator responsive to the amplifier direct current output for providing an output having a frequency corresponding to the amplifier output,
 alternating current constant peak-to-peak feedback means connecting the oscillator output to the alternating current input of said equating means whereby said equating means provides a control output through the amplifier to said oscillator for causing said oscillator frequency to vary as a linear function of the direct current input voltage, and
 means responsive to said oscillator output for providing an output at preselected frequencies.

2. A voltage level discriminator comprising,
 equating means equating a unidirectional voltage to the frequency of an alternating current having an alternating current input, a direct current input and a direct current output,
 means for connecting said direct current input to an independently variable source of direct current voltage,
 a high-gain direct current amplifier connected to said direct current output,
 an oscillator responsive to the amplifier direct current output for providing an output having a frequency corresponding to the amplifier output,
 alternating current constant peak-to-peak feedback means connecting the oscillator output to the alternating current input of said equating means whereby said equating means provides a control output through the amplifier to said oscillator for causing said oscillator frequency to vary as a linear function of the direct current input voltage, and
 means responsive to said oscillator output for providing a plurality of outputs each at different preselected frequencies.

3. A discriminator as set forth in claim 1 in which said equating means comprises,
 a pair of similarly poled serially connected rectifiers having the anode of one connected to said independently variable source through a resistor and the cathode of the other connected to a reference potential,
 first electric storage means connected across said rectifiers for smoothing current flow through the rectifiers and providing a direct current output to said high-gain amplifier, and
 second electric storage means connected between the common junction of said serially connected rectifiers and said feedback means.

4. A discriminator as set forth in claim 2 in which said equating means comprises,
 a pair of similarly poled serially connected rectifiers having the anode of one connected to said independently variable source through a resistor and the cathode of the other connected to a reference potential,
 first electric storage means connected across said rectifiers for smoothing current flow through the rectifiers and providing a direct current output to said high-gain amplifier, and
 second electric storage means connected between the common junction of said serially connected rectifiers and said feedback means.

5. A linear unidirectional voltage-to-frequency converter comprising,
 equating means equating a unidirectional voltage to the frequency of an alternating current having an alternating current input, a direct current input and a direct current output,
 means for connecting said direct current input to an independently variable source of direct current voltage,
 a high-gain direct current amplifier connected to said direct current output,
 an oscillator responsive to the amplifier direct current output for providing an output having a frequency corresponding to the amplifier output, and
 alternating current constant peak-to-peak feedback means connecting the oscillator output to the alternating current input of said equating means whereby said equating means provides a control output through the amplifier to said oscillator for causing said oscillator frequency to vary as a linear function of the direct current input voltage.

6. A linear unidirectional voltage-to-frequency converter as set forth in claim 5 in which said equating means comprises,
 a pair of similarly poled serially connected rectifiers having the anode of one connected to said independently variable source through a resistor and the cathode of the other connected to a reference potential,
 first electric storage means connected across said rectifiers for smoothing current flow through the rectifiers and providing a direct current output to said high-gain amplifier, and second electric storage means connected between the common junction of said serially connected rectifiers and said feedback means.

References Cited by the Examiner

UNITED STATES PATENTS

| | | | |
|---|---|---|---|
| 2,378,581 | 6/45 | Roberts | 332—1 X |
| 2,491,969 | 12/49 | Gloess | 332—18 X |
| 2,567,896 | 9/51 | Semm. | |
| 2,577,795 | 12/51 | Mohr | 332—18 |
| 3,003,123 | 10/61 | Runyan | 332—2 |
| 3,064,193 | 11/62 | Grubb et al. | 324—120 |
| 3,121,803 | 2/64 | Watters | 307—88.5 |
| 3,146,408 | 8/64 | Nissim et al. | 332—1 |

JOHN W. HUCKERT, *Primary Examiner.*

ARTHUR GAUSS, *Examiner.*